United States Patent [19]

Bratschun

[11] 3,996,502
[45] Dec. 7, 1976

[54] THICK FILM CAPACITORS
[75] Inventor: William R. Bratschun, La Grange, Ill.
[73] Assignee: Zenith Radio Corporation, Chicago, Ill.
[22] Filed: June 2, 1975
[21] Appl. No.: 582,955
[52] U.S. Cl. .............................. 317/258; 317/261
[51] Int. Cl.² ........................................ H01G 4/12
[58] Field of Search ........................... 317/261, 258

[56] References Cited
UNITED STATES PATENTS

| 2,908,593 | 10/1959 | Naidus | 317/258 |
|---|---|---|---|
| 2,956,219 | 10/1960 | Cianchi | 317/258 |
| 3,109,969 | 11/1963 | Seidel | 317/258 |
| 3,267,342 | 8/1966 | Pratt | 317/258 |
| 3,368,919 | 2/1968 | Casale | 317/258 |
| 3,673,092 | 6/1972 | Dietz | 317/258 |

Primary Examiner—E. A. Goldberg
Attorney, Agent, or Firm—Nicholas A. Camasto

[57] ABSTRACT

An alumina substrate thick film circuit includes capacitors sealed with two intermediate layers of non-conductive material and two layers of sealing glass. The temperature coefficient of expansion of the sealing glass is less than that of the substrate. The temperature coefficient of expansion of the intermediate layer material is intermediate those of the substrate and the sealing glass, or equal to that of the sealing glass.

5 Claims, 2 Drawing Figures

THICK FILM CAPACITORS

BACKGROUND OF THE INVENTION

The integrated circuit (IC) has introduced significant changes and improvement in electronic equipment design and manufacture. Hybrid integrated microcircuits are generally of two type — thin film or thick film. Thin film IC's comprise a plurality of components such as transistors, resistors, and capacitors incorporated in planar form on a silicon or high quality ceramic substrate. Some circuit elements are grown or formed on the substrate while others are deposited in an evacuated atmosphere, generally by sputtering or evaporation. The major disadvantage of thin film circuits is the high cost of the vacuum processing technology required. High valued capacitors are not available in this technology since large dielectric constant dielectrics are not practical.

Thick film hybrid circuits are generally characterized by a relatively inexpensive ceramic substrate and passive elements (resistors, conductors and capacitors) which are screen printed, in layers, and fired at high temperature as opposed to being vacuum deposited. One practical advantage is that thick film resistors are available in a wide range of values and they may be more readily trimmed to value than their film counterparts. Thick film circuit capacitors, may also be made with relatively high dielectric constants, up to 1000. However, the dielectric is porous and the capacitor should be hermetically sealed to prevent moisture from permeating the dielectric. Moisture in the dielectric can cause metal migration and shorting of electrodes when the capacitor is under an electrical field.

Ceramic type capacitors, which have been known for some time and have proven very satisfactory, often include a barium titanate-based dielectric. The normal 1350° C firing temperature for barium titanate dielectric materials introduces problems in thick film circuit manufacture. For commerical use, such as in television receivers, it is imperative that production costs of hybrid circuits be minimized and automated equipment is used wherever feasible. In modern thick film manufacturing equipment, the screened substrates are automatically fed through a belt-type furnace and stacked at the end of processing. However, the wire mesh belts used in the production equipment oxidize very rapidly at temperatures above 1050° C and experience rapid deterioration, leading to very short life.

In "pusher" type furnaces, ceramic slabs (which are not adversely affected by the high temperatures) are forced through the heating chamber. Not only are these furnaces expensive, they are very difficult to automate and to control. Their normal range of temperature is ±10° C, whereas for thick film processing, the temperature should be controlled to within ±2° C. The requisite temperature control may be attained by using a "batch" process, at the expense of the automation feature necessary to obtain reasonable production economy.

Barium titanate particles, when fired at 1350° C, fuse and become a strong dense material which, when used as a dielectric for a discrete capacitor, need not be sealed to prevent moisture penetration.

When fired at low temperatures, very little fusing of particles occurs and the material is extremely porous and fragile. As such it must be sealed. Mixing with a low temperature fusing glass improves both its porosity and strength charcteristics, but not sufficiently to avoid the need for sealing.

In addition to the reasons enumerated above, firing at lower temperatures permits use of other less costly materials. For example, in an air atmosphere, high firing temperatures dictate that the conductive material have a greater concentration of precious metal than when low firing temperatures are used. The conductive material used for the capacitor electrodes and conductors, when fired at 1000° C, is a silver palladium alloy. At a firing temperature of 1350° C, the conductive material is either palladium gold or platinum palladium. Either one of these two latter conductors is much more expensive than silver palladium conductors.

Another problem in using barium titanate as a dielectric material is the large disparity between the temperature coefficients of expansion (TCE) of the alumina substrate and the dielectric. Even at lower firing temperatures and using a mixture of glass and barium titanate particles, some cracking of the dielectric layer is still experienced. Minor cracking of the dielectric is not harmful if a suitable seal is provided.

The sealing problem for thick film capacitors is much different from that for normal "discrete" ceramic capacitors. In the latter each unit is inherently dense and atmospheric moisture may not penetrate it. A simple organic coating prevents surface conduction. In a thick film circuit the capacitors have porous dielectrics and they must be sealed against atmospheric moisture.

Thick film capacitors readily fail when subjected to an electrical field under high humidity conditions. The failure apparently occurs because of the formation of metallic ions in the presence of water vapor which subsequently migrate from the negative electrode to the positive electrode. The ions thereupon convert to the metallic form and a dendritic buildup of the metal occurs on the positive electrode until a short develops through the dielectric. It has been found in the case of and AgPd conductor with a $Bi_2O_3$ glass frit system that the migrating metal is bismuth. Apparently the bismuth is ionized and transported to the positive electrode by the DC field gradient. It is de-ionized there and bismuth metal dendrites form and grow toward the negative electrode. When the bismuth reaches the negative electrode, a short develops. The failure thus seems to require a source of ions, a porous dielectric and an electrical field. If moisture is prevented from reaching the dielectric, the metallic ions will not form and this type of failure should not occur.

Organic film coatings are too permeable to moisture to protect the capacitor. Bulky organic encapsulants are not practical since they are very expensive and also may interfere with leads and components to be attached to the substrate. It has been found that thick film capacitors may be protected with glass films which have very low permeability rates to water vapor as well as to all gases.

Attempts to seal the thick film capacitor with a liquid glass failed because the glass actually flows into the pore structure of the top electrode and dielectric layer and lowers the capacitance. Viscous glass sealants also result in poor seals and subsequent degradation of the capacitor under atmospheric conditions, believed mainly due to voids and bubbles in the glass and inadequate glass-to-substrate bonding. The TCE of the sealing glass also poses a problem in that if the disparity between it and the TCE of the underlying support layers substrate is great, cracking will occur. This, of course, results in an unusable device because of seal failure. Still other attempts were directed at producing a barrier between the capacitor, per se, and the sealing glass to avoid glass penetration of the dielectric. While these attempts met with varied degrees of success, the "yields" were unsatisfactory for production purposes.

As mentioned, generally each capacitor is individually sealed, although they may be grouped so as to have several with a common seal system. When it is considered that a thick film integrated circuit may need as many as 30 capacitor seals, the yield for each capacitor seal must be extremely high to get a reasonably acceptable yield of finished substrates. Since the processed substrate is subjected to active component attachment and soldering (as well as resistor trimming) it cannot have an overall seal coating. Thus the yields of each capacitor seal must be successively multiplied by all capacitor seals to obtain the substrate yield for capacitor seals.

OBJECTS OF THE INVENTION

Accordingly a primary object of this invention is to provide a novel thick film capacitor.

Another object of this invention is to provide a thick film capacitor having improved characteristics.

SUMMARY OF THE INVENTION

The thick film capacitors of the invention are formed with an intermediate layer between the capacitor and the glass sealing layer. The intermediate layer not only provides a support for the sealing layer but is formulated to have a TCE intermediate the TCE of the substrate and the TCE of the glass sealing layer, (it may be equal to the TCE of the glass sealing layer). Since the sealing glass has a TCE less than that of the substrate it is placed in compression which helps prevent its being cracked.

The intermediate layer provides a support for the sealing glass which is less porous than the dielectric layer, prevents the highly fluid reactive sealing glass from degrading the capacitor, and helps to absorb stresses due to TCE mismatch between the barium titanate dielectric and the alumina substrate.

The glass sealing layer seals the capacitor from atmospheric moisture and other contaminants. It is also physically strong and chemcially resistant to withstand normal handling abuse and processing conditions. The glass layer is designed to flow sufficiently to fill voids in the intermediate layers, to form a complete seal along the capacitor periphery, which includes the alumina substrate and electrode connections, and to be of a slightly lower TCE than the alumina substrate.

BRIEF DESCRIPTION OF THE DRAWING

Other objects and advantages of this invention will become apparent upon reading the following specification in conjunction with the drawing in which.

DESCRIPTION OF THE PREFERRED EMBODIMENT

Figure 1:
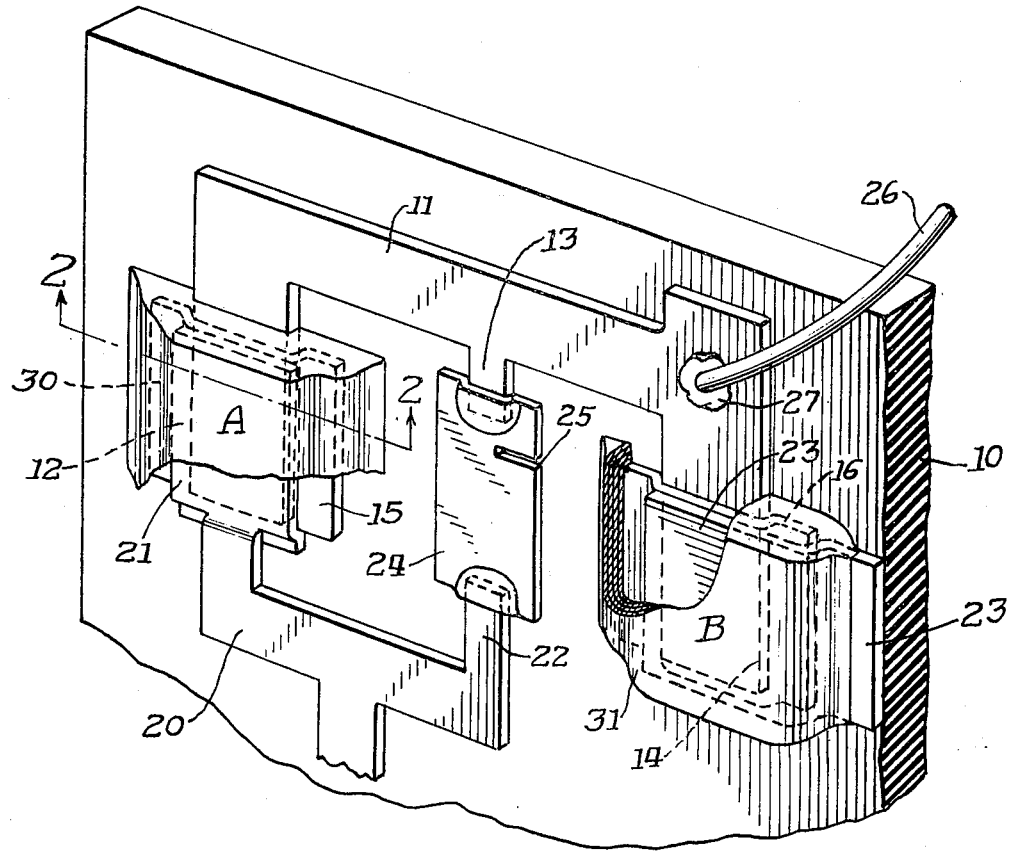
FIG. 1 is a idealized representation of a portion of a thick film substrate incorporating capacitors constructed in accordance with the invention.

Referring to FIG. 1, there is shown a portion of a thick film circuit having capacitors A and B constructed in accordance with the invention. Substrate 10 may comprise any suitable ceramic material, alumina being preferred. A conductive pattern 11 includes a generally rectangular area forming a base electrode 12 for capacitor A, a short stub-like projection forming a resistor connection 13 and a generally rectangular area forming a base electrode 14 for capacitor B. Conductive pattern 11 is the first layer of material printed, dried and fired onto substrate 10. It will be appreciated that the complete substrate includes many conductive patterns deposited or screened simultaneously with similar type patterns 11.

A dielectric 15 overlies base electrode 12 in capacitor A and a dielectric 16 overlies base electrode 14 in Capacitor B. The dielectric material is also screened onto or printed on the substrate in an appropriate pattern to correspond with other capacitor base electrodes. Another conductive pattern 20, including a generally rectangular area forming a top electrode 21 for capacitor A, overlies dielectric 15. Conductive pattern 20 also includes a stub-like projection forming a second resistor connection 22. As shown, the top electrode is about the same size as the base electrode. However, it may obviously be larger or smaller and size is not critical. Similarly, a top electrode 23 is in overlying relationship with dielectric 16 and together with base electrode 14, form capacitor B. Both top electrodes 21 and 23 are deposited or screened simultaneously on the substrate as parts of appropriate patterns 20 that conform to the desired circuit configuration.

Block 24 represents deposited resistive material bridging connections 13 and 22. Slit 25 in the resistive material is the result of a trimming adjustment of its resistance which, as is well known in the art, may be performed with an appropriately controlled laser beam or san abrasion apparatus.

Hermetic seals 30 and 31 encapsulate capacitors A and B, respectively. The seals are partially broken away for clarity, and, as shown for seal 31, comprise four layers of material. An external connecting lead 26 is connected to conductive pattern 11 at a solder connection 27. The method employed in fabricating the capacitors of the invention is that a 2 inch × 3 inch × 0.040 fired 96% alumina substrate is screen printed with a base electrode and conductor pattern. The exact lengths, widths, and thicknesses are not critical. The electrode material comprises an ink of a vehicle and binder with a silver palladium alloy. A commercial conductor such as Du Pont 8151 or Cromalloy 4027 is suitable. The printed ink is dried at 125° C for 5 minutes. The drying temperature and time are not critical but must be such as to evaporate the vehicle without causing bubbles in the film nor loss of adhesion to the substrate The substrate is then fired at 1000° C with a 5 minute soak. In all of the firings normal precautions are exercised to allow complete binder burnout and to avoid thermal shock. A thick film furnace such as made by B.T.U., Watkin-Johnson, or Lindburg is suitable to achieve a desirable firing profile.

A 20 minute total firing cycle is adequate. A dielectric material such as barium titanate prepared as a thick film ink or commercially available inks such as Electro oxide 6285 may be printed in an appropriate pattern and dried. The top electrode-conductor pattern is printed and dried with its composition being the same as that of the base electrode. A first intermediate layer ink comprising a mixture of aluminum oxide powder and high temperature glass is printed, dried, and fired at 1000°C with a five minute soak. It should be noted that the dielectric layer and top electrode are "cofired" with the first intermediate layer. A second intermediate layer may be similarly printed, dried and fired to help eliminate any flaws in the first intermediate layer. With the co-firing technique, some of the glass in the top electrode diffuses into the dielectric and helps to sinter it. Thus the dielectric may consist of barium titanate particles in a suitable vehicle rather than using a mixture of glass and barium titanate particles. A glass sealing layer ink is then printed, dried, and fired at 875° C for 5 minutes after which an identical second glass sealing layer is applied in the same manner.

The system of the invention exhibits a very high yield of capacitor seals-on the order of 99.98% under 95% relative humidity, 40° C, 60VDC humidity-electrical load conditions-when using two intermediate layers and two glass sealing layers.

A wide variety of electrodes, dielectrics, intermediate layers, and glass sealing layers may be used. The intermediate layer may consist of a refractory glass-ceramic, zircon, zirconia, cordierite, quartz, fused silica, hexacelsion, etc. in place of the alumina mentioned. Different glass sealing layers may also be formulated to mature at a wide range of temperatures.

The processing steps do not constitute a part of this invention. The techniques of printing, drying and firing precious metal electrodes and resistance and dielectric materials are believed well known in the art. For details concerning processing, refer to "Preparation of Screen Printing Inks," in "Circuits Manufacturing (October 1973)"; "Rheology of Pastes and Thick Film Printing" By Ralph Treese and Ray Dietz in *Solid State Technology* (January, 1972); "Squeegee Pressure and Thick Film Resistor Fabrication" by W. Atkinson in *Solid State Technology*, (May, 1971); "Silver Palladium Fired Electrodes" by L. Miller in the *Proceedings of the Electronic Components Conference*, (1968); "Conductive Element, Composition and Method," U.S. Pat. No. 3,374,110 and "Screenability and Rheology" by L. F. Miller, *Solid State Technology* (October, 1974).

Figure 2:
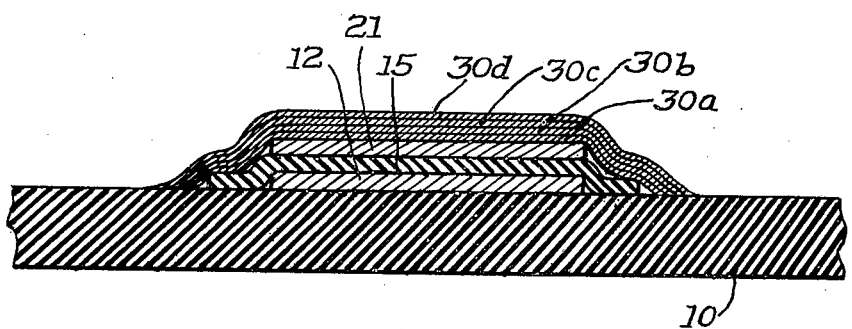
FIG. 2 is an idealized cross section representation of capacitor A of FIG. 1 taken along the line 2—2.

In FIG. 2 base electrode 12 is seen to be in direct contact with substrate 10 and is formed by screening conductive material on the substrate. Dielectric 15 overlies base electrode 12 and also contacts substrate 10 at its extremities. Top electrode 21 overlies dielectric 15 and, except for a connection portion in pattern 20 (not shown) does not contact the substrate. A first intermediate layer 30a overlies top electrode 21 and the portion of dielectric 15 not covered by the top electrode and contacts substrate 10 around its periphery. A seccond intermediate layer 30b overlies layer 30a in similar fashion. Also first and second glass sealing layers 30c and 30d are in successive overlying positions and contact substrate 10 at their peripheries.

It will be recognized that the capacitor of the invention does not require use of two intermediate layers nor two glass sealing layers. However as mentioned, an extremely high yield of satisfactory seals is obtained by incorporating two intermediate and two glass sealing layers.

What has been described is a novel thick film capacitor which overcomes the sealing limitations exhibited by thick film capacitors of the prior art.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A multi-layered thick film circuit deposited on a non-conductive substrate, which has a first temperature coefficient of expansion, forming a capacitor comprising:
    a first layer of conductive material;
    a second layer of dielectric material;
    a third layer of conductive material;
    a fourth layer of insulating material having a second temperature coefficient of expansion;
    a fifth layer overlying said fourth layer and extending beyond said other layers into contact with said substrate for sealing said circuit and having a third temperature coefficient of expansion equal to or less than said first temperature coefficient and less than said second temperature coefficient; and
    means making electrical connection to said first and third conductive layers.

2. A thick film circuit as set forth in claim 1 wherein said second layer is a mixture of barium titanate and glass particles.

3. A thick film circuit as set forth in claim 2 wherein said fourth layer comprises an insulating mixture of high temperature glass and aluminum oxide powder.

4. A thick film circuit as set forth in claim 3 wherein said fourth layer comprises two separate applications of said insulating mixture, each of which are fired with the substrate.

5. A thick film circuit as set forth in claim 4 wherein said fifth layer comprises two separate coatings of sealing glass fired with the substrate.

* * * * *